US006746751B2

(12) United States Patent
Lamotte et al.

(10) Patent No.: US 6,746,751 B2
(45) Date of Patent: Jun. 8, 2004

(54) MATERIAL HAVING A CONDUCTIVE PATTERN AND A MATERIAL AND METHOD FOR MAKING A CONDUCTIVE PATTERN

(75) Inventors: Johan Lamotte, Rotselaar (BE); David Terrell, Lint (BE)

(73) Assignee: Agfa-Gevaert, Mortsel (BE)

( * ) Notice: Subject to any disclaimer, the term of this patent is extended or adjusted under 35 U.S.C. 154(b) by 0 days.

(21) Appl. No.: 10/175,989

(22) Filed: Jun. 20, 2002

(65) Prior Publication Data

US 2003/0124319 A1 Jul. 3, 2003

Related U.S. Application Data

(60) Provisional application No. 60/350,731, filed on Jan. 22, 2002.

(30) Foreign Application Priority Data

Jun. 22, 2001 (WO) ................................... Pct/01/07083
Dec. 10, 2001 (EP) ............................. 01000731

(51) Int. Cl.$^7$ ............................ B32B 27/00; H01B 1/00
(52) U.S. Cl. ................ 428/141; 428/195; 428/500; 428/704; 252/518.1; 252/519.14; 252/519.34; 528/373; 528/377; 528/378; 534/676; 534/677; 534/678; 534/679; 534/681
(58) Field of Search ................ 428/141, 195, 428/331, 500, 704, 689, 339; 252/500, 518.1, 519.14, 519.34; 528/373, 377, 378; 534/676–679, 681

(56) References Cited

U.S. PATENT DOCUMENTS

| 3,235,384 A | 2/1966 | Neugebauer et al. |
| 5,137,799 A | 8/1992 | Kaempf et al. |
| 5,370,825 A | * 12/1994 | Angelopoulos et al. ..... 252/500 |
| 5,561,030 A | 10/1996 | Holdcroft et al. |
| 5,721,091 A | 2/1998 | Watanabe et al. |
| 5,766,515 A | * 6/1998 | Jonas et al. ................ 252/500 |
| 6,288,187 B1 | 9/2001 | Armand |
| 2001/0024749 A1 | 9/2001 | Michot et al. |
| 2002/0026021 A1 | 2/2002 | Armand et al. |

FOREIGN PATENT DOCUMENTS

| DE | 1214 086 | 10/1960 |
| EP | 0 338 786 A2 | 10/1989 |
| EP | 0 413 559 A2 | 2/1991 |
| EP | 0 540 448 A1 | 5/1993 |
| EP | 0 614 123 A1 | 9/1994 |
| EP | 0 440 957 B1 | 3/1996 |
| EP | 0 771 645 B | 5/1997 |
| EP | 1 003 179 A1 | 5/2000 |
| EP | 0 564 911 B1 | 6/2001 |
| EP | 0 686 662 B1 | 11/2002 |
| WO | WO 94/07612 A1 | 4/1994 |
| WO | WO 97/18944 A1 | 5/1997 |
| WO | WO 01/88958 A2 | 11/2001 |

OTHER PUBLICATIONS

Angelopoulos et al.; "Water Soluble Conducting Polyanilines: Applications in Lithography," *Journal of Vacuum Science and Technology*, 11 (6), 2794–2797 (Nov./Dec. 1993).
Lerch et al.; "Properties and Applications of Baytron (PEDT)," *J. Chem. Phys*, 95, 1506–1509 (1998).
Search Report for EP 01 00 0731, Jul. 1, 2002.
Search Report for PCT/EP02/06740, Sep. 13, 2002.

* cited by examiner

Primary Examiner—Deborah Jones
Assistant Examiner—Ling Xu
(74) Attorney, Agent, or Firm—Leydig, Voit & Mayer, Ltd.

(57) ABSTRACT

A material for making a conductive pattern, the material comprising a support and a conductive element, the conductive element containing a polyanion and an intrinsically conductive polymer, characterized in that one surface of the conductive element is an outermost surface of the material, the other surface of the conductive element is contiguous with a patterned surface, the patterned surface consisting of at least two types of surface element, and those parts of the conductive element contiguous with one type of the surface elements are capable of being at least partially removed by a developer.

50 Claims, No Drawings

MATERIAL HAVING A CONDUCTIVE PATTERN AND A MATERIAL AND METHOD FOR MAKING A CONDUCTIVE PATTERN

The applications claims the benefit of U.S. Provisional Application No. 60/350,731 filed Jan. 22, 2002, which is herein incorporated by reference.

FIELD OF THE INVENTION

The present invention relates to a material and a method for making a conductive pattern.

BACKGROUND OF THE INVENTION

Transparent ITO (indium-tin oxide) electrodes are used for the fabrication of flexible LC displays, electroluminescent devices and photovoltaic cells. These electrodes are made by vacuum sputtering ITO onto a substrate. This method involves high temperatures, up to 250° C., and therefore glass substrates are generally used. The range of potential applications is limited, because of the high fabrication costs, the low flexibility (pliability) and stretchability, due to the brittleness of the ITO layer and the glass substrate. Therefore interest is growing in all-organic devices, comprising plastic resins as a substrate and organic intrinsically conductive polymer layers as electrodes. Such plastic electronics allow the realization of low cost devices with new properties (Physics World, March 1999, p.25–39). Flexible plastic substrates can be provided with an intrinsically conductive polymer layer by continuous roller coating methods (compared to batch process such as sputtering) and the resulting organic electrodes enable the fabrication of electronic devices with higher flexibility and a lower weight.

The production and use of intrinsically conductive polymers such as polypyrrole, polyaniline, polyacetylene, polyparaphenylene, polythiophene, polyphenylenevinylene, polythienylenevinylene and polyphenylenesulphide are known in the art.

EP-A 440 957 discloses dispersions of polythiophenes, constructed from structural units of formula (I):

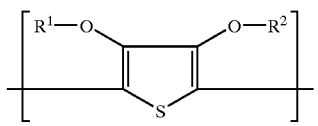

in which $R^1$ and $R^2$ independently of one another represent hydrogen or a $C_{1-4}$-alkyl group or together form an optionally substituted $C_{1-4}$-alkylene residue, in the presence of polyanions. Furthermore, EP-A-686 662 discloses mixtures of A) neutral polythiophenes with the repeating structural unit of formula (I),

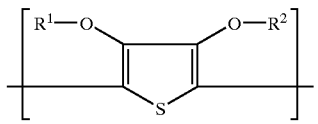

in which $R^1$ and $R^2$ independently of one another represent hydrogen or a $C_{1-4}$-alkyl group or together represent an optionally substituted $C_{1-4}$-alkylene residue, preferably an optionally with alkyl group substituted methylene, an optionally with $C_{1-12}$-alkyl or phenyl group substituted 1,2-ethylene residue or a 1,2-cyclohexene residue, and B) a di- or polyhydroxy- and/or carboxy groups or amide or lactam group containing organic compound; and conductive coatings therefrom which are tempered at elevated temperature, preferably between 100 and 250° C., during preferably 1 to 90 seconds to increase their resistance preferably to <300 ohm/square.

Coated layers of organic intrinsically conductive polymers can be structured into patterns using known microlithographic techniques. In WO-A-97 18944 a process is described wherein a positive or negative photoresist is applied on top of a coated layer of an organic intrinsically conductive polymer, and after the steps of selectively exposing the photoresist to UV light, developing the photoresist, etching the intrinsically conductive polymer layer and finally stripping the non-developed photoresist with an organic solvent, a patterned layer is obtained. A similar technique has been described in 1988 in Synthetic Metals, volume 22, pages 265–271 for the design of an all-organic thin-film transistor. Such methods are cumbersome as they involve many steps and require the use of hazardous chemicals.

WO 01/88958 published on Nov. 22, 2001 discloses a method of forming a pattern of a functional material on a substrate comprising: applying a first pattern of a first material to said substrate; and applying a second functional material to said substrate and said first material, wherein said first material, said second functional material, and said substrate interact to spontaneously form a second pattern of said second functional material on said substrate, to thereby form a pattern of a functional material a substrate.

Aspects of the Invention

It is an aspect of the present invention to provide a process for making a conductive pattern, which does not require the use of hazardous chemicals.

It is a further aspect of the present invention to provide a material having a conductive pattern without a development step.

It is a further aspect of the present invention to provide a material having a conductive element that can be processed to a conductive pattern by a simple, convenient method which involves a low number of steps and which does not require the use of hazardous chemicals.

Further aspects and advantages of the invention will become apparent from the description hereinafter.

SUMMARY OF THE INVENTION

A conductive pattern can be realized with the materials of the present invention, which are optionally conductivity enhanced, without image-wise heating or exposure and with optionally a single wet processing step, and optional conductivity enhancement. No etching liquids or organic solvents are required. Furthermore, a conductive pattern is realized in layers ≦500 nm thick without processing.

Aspects of the present invention are realized by a material having a conductive pattern, the material comprising a support and a conductive element, the conductive element being 500 nm thick or less and containing a polyanion and an intrinsically conductive polymer, characterized in that one surface of the conductive element is an outermost surface of the material and the other surface of the conductive element is contiguous with a patterned surface, the patterned surface consisting of at least two types of surface element, and those parts of the conductive element contiguous with a type A surface element exhibiting a surface resistance at least a factor of ten greater than those parts of the conductive element contiguous with a type B surface element.

Aspects of the present invention are also realized by a material for making a conductive pattern, the material comprising a support and a conductive element, the conductive element containing a polyanion and an intrinsically conductive polymer, characterized in that one surface of the conductive element is an outermost surface of the material, the other surface of the conductive element is contiguous with a patterned surface, the patterned surface consisting of at least two types of surface element, and those parts of the conductive element contiguous with one type of the surface elements are capable of being at least partially removed by a developer.

Aspects of the present invention are also realized by a method of making a conductive pattern on a support comprising the steps of: providing a material for making a conductive pattern as disclosed above; processing the material with a developer, thereby at least partially removing those parts of the conductive element contiguous with one type of the surface elements; and optionally treating the material to increase the electroconductivity of the material.

Further advantages and embodiments of the present invention will become apparent from the following description.

DETAILED DESCRIPTION OF THE INVENTION

Definitions

The term "support" means a "self-supporting material" so as to distinguish it from a "layer" which may be coated on a support, but which is itself not self-supporting. It also includes any treatment necessary for, or layer applied to aid, adhesion to the differentiable element.

The term conductive means having a surface resistance or $10^{11}$ Ω/square or less and is a generic term including both the terms antistatic and electroconductive.

The term electroconductive means having a surface resistance below $10^6$ Ω/square. Antistatic materials have surface resistances in the range from $10^6$ to $10^{11}$ Ω/square and cannot be used as an electrode.

The term conductive pattern means a pattern with elements which have different surface resistances.

The term intrinsically conductive polymer means organic polymers which have (poly)-conjugated π-electron systems (e.g. double bonds, aromatic or heteroaromatic rings or triple bonds) and whose conductive properties are not influenced by environmental factors such as relative humidity.

The term continuous layer refers to a layer in a single plane covering the whole area of the support and not necessarily in direct contact with the support.

The term non-continuous layer refers to a layer in a single plane not covering the whole area of the support and not necessarily in direct contact with the support.

Conductivity enhancement refers to a process in which the conductivity is enhanced e.g. by contact with high boiling point liquids such as di- or polyhydroxy- and/or carboxy groups or amide or lactam group containing organic compound optionally followed by heating at elevated temperature, preferably between 100 and 250° C., during preferably 1 to 90 seconds, results in conductivity increase. Alternatively in the case of aprotic compounds with a dielectric constant ≧15, e.g. N-methyl-pyrrolidinone, temperatures below 100° C. can be used. Such conductivity enhancement is observed with polythiophenes and can take place during the preparation of the outermost layer or subsequently. Particularly preferred liquids for such treatment are N-methyl-pyrrolidinone and diethylene glycol such as disclosed in EP-A 686 662 and EP-A 1 003 179.

The term removability as used in the description and claims of the present invention means mechanically removable in the absence of a liquid or removable with the application of a liquid with or without the simultaneous or subsequent use of rubbing or other mechanical removal means. The application of liquid can dissolve, swell or disperse the outermost layer according to the present invention such that removal is realized or enabled.

The term multidiazonium salt includes all compounds with at least two groups with two nitrogen atoms bonded together with a double or triple bond, such groups including —N≡N$^+$ and —N=N—R groups e.g. —N=N—SO$_3$M groups.

The term resin comprising a diazonium salt means a resin with groups with two nitrogen atoms bonded together with a double or triple bond, such groups including —N≡N$^+$ and —N=N—R groups e.g. —N=N—SO$_3$M groups.

The term proteinaceous means pertaining to any material having a protein base.

Material Having a Conductive Pattern

The material having a conductive pattern, according to the present invention, has a conductive element 500 nm or less thick contiguous with a patterned surface consisting of at least two types of surface element. Contact of these types of surface elements with the conductive element results in a lower surface resistance of those parts of the conductive element contiguous with one type of surface element than those parts of the conductive element contiguous with another type of surface element. Each type of surface element lies in the same plane, but all surface elements need not lie in the same plane.

The reason for this effect is unknown, but the effect is only observed for conductive elements with a thickness of 500 nm or less. At such thicknesses, the thinness of conductive element means that the interfacial forces between the conductive element and the patterned surface during coating and during and after drying will have a considerable effect on the properties of the electroconductive layer and hence possibly on the surface resistance thereof.

According to a first embodiment of a material having a conductive pattern, according to the present invention, the conductive pattern is an electroconductive pattern.

According to a second embodiment of a material having a conductive pattern, according to the present invention, the patterned surface is planar or non-planar. A non-planar pattern can be produced using conventional printing techniques, such as screen printing, offset printing, flexographic printing and ink jet printing, with conventional resist technology, plasma etching techniques.

According to a third embodiment of a material having a conductive pattern, according to the present invention, the patterned surface is planar and is the surface of the support or a patternwise treated continuous layer. The patterning of the continuous layer or the support can, for example, be realized by patternwise treatment with an electron beam, ion implantation, a corona discharge or a glow discharge.

According to a fourth embodiment of a material having a conductive pattern, according to the present invention, the patterned surface is planar and is a continuous layer which is patternwise treated with a corona discharge or a glow discharge.

According to a fifth embodiment of a material having a conductive pattern, according to the present invention, the patterned surface is non-planar and consists of a non-continuous layer provided on a continuous layer or on the support. The non-continuous layer can be produced using conventional printing techniques, such as screen printing, offset printing, flexographic printing and ink jet printing, with conventional resist technology, plasma etching techniques.

According to a sixth embodiment of a material having a conductive pattern, according to the present invention, the conductive element has a surface resistance lower than $10^6$ $\Omega$/square.

According to a seventh embodiment of a material having a conductive pattern, according to the present invention, the conductive element has a surface resistance lower than $10^4$ $\Omega$/square.

According to an eighth embodiment of a material having a conductive pattern, according to the present invention, the conductive element has a surface resistance capable of being lower than $10^6$ $\Omega$/square after treatment in a so-called conductivity enhancement process.

According to a ninth embodiment of a material having a conductive pattern, according to the present invention, the conductive element further contains a multidiazonium salt, a resin comprising a diazonium salt or both a multidiazonium salt and a resin comprising a diazonium salt, which reduces the removability of those parts of the conductive element contiguous with the patterned surface not removed during the development step. Combinations of resins comprising a diazonium salt can also be used.

Material for Making a Conductive Pattern

Aspects of the present invention are realized by a material for making a conductive pattern, the material comprising a support and a conductive element, the conductive element containing a polyanion and an intrinsically conductive polymer, characterized in that one surface of the conductive element is an outermost surface of the material, the other surface of the conductive element is contiguous with a patterned surface, the patterned surface consisting of at least two types of surface element, and those arts of the conductive element contiguous with one type of surface element are capable of being at least partially removed by a developer. The term patterned surface, according to the material for making a conductive pattern, according to the present invention, means a surface with at least two types of surface elements exhibiting different abilities to adhere to the contiguous conductive element. This variation in the ability of elements of the surface to adhere to the contiguous conductive element over the patterned surface forms a pattern.

According to a first embodiment of a material for making a conductive pattern, according to the present invention, the conductive pattern is an electroconductive pattern.

According to a second embodiment of a material for making a conductive pattern, according to the present invention, the patterned surface is planar or non-planar. A non-planar pattern can be produced using conventional printing techniques, such as screen printing, offset printing, flexographic printing and ink jet printing, with conventional resist technology, plasma etching techniques.

According to a third embodiment of a material for making a conductive pattern, according to the present invention, the patterned surface is planar and is the surface of the support or a patternwise treated continuous layer. The patterning of the continuous layer or the support can, for example, be realized by patternwise treatment with an electron beam, ion implantation, a corona discharge or a glow discharge.

According to a fourth embodiment of a material for making a conductive pattern, according to the present invention, the patterned surface is a continuous layer which is patternwise treated with a corona discharge or a glow discharge.

According to a fifth embodiment of a material for making a conductive pattern, according to the present invention, the patterned surface is non-planar and consists of a non-continuous layer provided on a continuous layer or on the support. The non-continuous layer can be produced using conventional printing techniques, such as screen printing, offset printing, flexographic printing and ink jet printing, with conventional resist technology, plasma etching techniques.

According to a sixth embodiment of a material for making a conductive pattern, according to the present invention, the conductive element further contains an element which upon light exposure produces changes in the properties or composition of the exposed parts of the element.

Examples of such changes in the properties or composition of the exposed parts of the element are exposure-induced crosslinking; exposure-induced decrease of solubility; and exposure-induced increase of adhesion to the patterned surface of the non-removed parts of the conductive element.

According to a seventh embodiment of a material for making a conductive pattern, according to the present invention, the conductive element has a surface resistance lower than $10^6$ $\Omega$/square.

According to an eighth embodiment of a material for making a conductive pattern, according to the present invention, the conductive element has a surface resistance lower than $10^4$ $\Omega$/square.

A conductive pattern can be rendered electroconductive by a post-treatment process, such as a conductivity enhancement process. According to a ninth embodiment of a material for making a conductive pattern, according to the present invention, the conductive element has a surface resistance capable of being lower than $10^6$ $\Omega$/square after treatment in a so-called conductivity enhancement process.

Conductive

The term "conductive" is related to the electric resistance of the material. The electric resistance of a layer is generally expressed in terms of surface resistance $R_s$ (unit $\Omega$; often specified as $\Omega$/square). Alternatively, the conductivity may be expressed in terms of volume resistivity $R_v=R_s \cdot d$, wherein d is the thickness of the layer, volume conductivity $k_v=1/R_v$ [unit: S(iemens)/cm] or surface conductance $k_s=1/R_s$ [unit: S(iemens)·square].

All values of electric resistance presented herein are measured according to one of the following methods. In the first method the support coated with the electroconductive outermost layer is cut to obtain a strip having a length of 27.5 cm and a width of 35 mm and strip electrodes are applied over its width at a distance of 10 cm perpendicular to the edge of the strip. The electrodes are made of an intrinsically conductive polymer, ECCOCOAT CC-2 available from Emerson & Cumming Speciality polymers. Over the electrode a constant potential is applied and the current flowing through the circuit is measured on a pico-amperometer KEITHLEY 485. From the potential and the current, taking into account the geometry of the area between the electrodes, the surface resistance in $\Omega$/square is calculated.

In the second method, the surface resistance was measured by contacting the outermost layer with parallel copper electrodes each 35 mm long and 35 mm apart capable of forming line contacts, the electrodes being separated by a teflon insulator. This enables a direct measurement of the surface resistance.

Support

Supports for use according to the present invention include polymeric films, silicon, ceramics, oxides, glass, polymeric film reinforced glass, glass/plastic laminates, metal/plastic laminates, paper and laminated paper, optionally treated, provided with a subbing layer or other adhesion promoting means to aid adhesion to the light-exposure differentiable element. Suitable polymeric films are poly(ethylene terephthalate), poly(ethylene naphthalate), polystyrene, polyethersulphone, polycarbonate, polyacrylate, polyamide, polyimides, cellulosetriacetate, polyolefins and polyvinylchloride, optionally treated by corona discharge or glow discharge or provided with a subbing layer.

Conductive Element

The conductive element used in the material of the present invention contains an intrinsically conductive polymer and can consist of one or more continuous layers.

Intrinsically Conductive Polymer

The intrinsically conductive polymers used in the present invention can be any intrinsically conductive polymer known in the art e.g. polyacetylene, polypyrrole, polyaniline, polythiophene, etc. Details about suitable intrinsically conductive polymers can be found in textbooks, such as "Advances in Synthetic Metals", ed. P. Bernier, S. Lefrant, and G. Bidan, Elsevier, 1999; "Intrinsically Conducting Polymers: An Emerging Technology", Kluwer (1993); "Conducting Polymer Fundamentals and Applications, A Practical Approach", P. Chandrasekhar, Kluwer, 1999; and "Handbook of Organic Conducting Molecules and Polymers", Ed. Walwa, Vol. 1–4, Marcel Dekker Inc. (1997).

According to a tenth embodiment of the material having a conductive pattern, according to the present invention, or a tenth embodiment or the material for making a conductive pattern, according to the present invention, the intrinsically conductive polymer is a polyanion and a polymer or copolymer of a substituted or unsubstituted thiophene.

According to an eleventh embodiment of the material having a conductive pattern, according to the present invention, or an eleventh embodiment or the material for making a conductive pattern, according to the present invention, the intrinsically conductive polymer is a substituted or unsubstituted thiophene represented by formula (I):

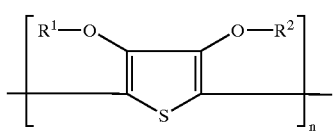

(I)

in which n is larger than 1 and each of $R^1$ and $R^2$ independently represents hydrogen or an optionally substituted $C_{1-4}$ alkyl group or together represent an optionally substituted $C_{1-4}$ alkylene group or an optionally substituted cycloalkylene group, preferably an ethylene group, an optionally alkyl-substituted methylene group, an optionally $C_{1-12}$ alkyl- or phenyl-substituted ethylene group, a 1,3-propylene group or a 1,2-cyclohexylene group.

The preparation of such a polythiophene and of aqueous dispersions containing such a polythiophene and a polyanion is described in EP-A-440 957 and corresponding U.S. Pat. No. 5,300,575. Basically the preparation of polythiophene proceeds in the presence of polymeric polyanion compounds by oxidative polymerisation of 3,4-dialkoxythiophenes or 3,4-alkylenedioxythiophenes according to the following formula:

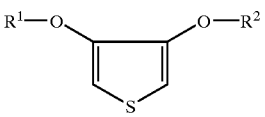

wherein $R^1$ and $R^2$ are as defined above.

Stable aqueous polythiophene dispersions having a solids content of 0.05 to 55% by weight and preferably of 0.1 to 10% by weight can be obtained by dissolving thiophenes corresponding to the formula above, a polyacid and an oxidising agent in an organic solvent or preferably in water, optionally containing a certain amount of organic solvent, and then stirring the resulting solution or emulsion at 0° C. to 100° C. until the polymerisation reaction is completed. The polythiophenes formed by the oxidative polymerisation are positively charged, the location and number of such positive charges being not determinable with certainty and therefore not mentioned in the general formula of the repeating units of the polythiophene polymer.

The oxidising agents are those which are typically used for the oxidative polymerisation of pyrrole as described in for example J. Am. Soc. 85, 454 (1963). Preferred inexpensive and easy-to-handle oxidising agents are iron(III) salts, e.g. $FeCl_3$, $Fe(ClO_4)_3$ and the iron(III) salts of organic acids and inorganic acids containing organic residues. Other suitable oxidising agents are $H_2O_2$, $K_2Cr_2O_7$, alkali or ammonium persulphates, alkali perborates, potassium permanganate and copper salts such as copper tetrafluoroborate. Air or oxygen can also be used as oxidising agents. Theoretically, 2.25 equivalents of oxidising agent per mol of thiophene are required for the oxidative polymerisation thereof (J. Polym. Sci. Part A, Polymer Chemistry, Vol. 26, p.1287, 1988). In practice, however, the oxidising agent is used in excess, for example, in excess of 0.1 to 2 equivalents per mol of thiophene.

Polyanion

The polyacid forms a polyanion or, alternatively, the polyanion can be added as a salt of the corresponding polyacids, e.g. an alkali salt. Preferred polyacids or salts thereof are polymeric carboxylic acids such as poly(acrylic acid), poly((meth)acrylic acid) and poly(maleic acid) or polymeric sulphonic acids such as poly(styrene sulphonic acid) or poly(vinyl sulphonic acid). Alternatively, copolymers of such carboxylic and/or sulphonic acids and of other polymerizable monomers such as styrene or acrylates can be used.

According to a twelfth embodiment of the material having a conductive pattern, according to the present invention, or a twelfth embodiment or the material for making a conductive pattern, according to the present invention, the polyanion is poly(styrenesulphonate).

The molecular weight of these polyanion forming polyacids is preferably between 1000 and $2 \times 10^6$, more preferably between 2000 and $5 \times 10^5$. These polyacids or their alkali salts are commercially available and can be prepared according to the known methods, e.g. as described in Houben-Weyl, Methoden der Organische Chemie, Bd. E20 Makromolekulare Stoffe, Teil 2, (1987), pp. 1141.

Binders

In the materials having a conductive pattern and for making a conductive pattern, according to the present invention, the conductive element, surface elements and layers of the material, according to the present invention, may contain a binder.

According to a thirteenth embodiment of the material having a conductive pattern, according to the present invention, or a thirteenth embodiment or the material for making a conductive pattern, according to the present invention, the conductive element further contains a binder, e.g. polyvinyl alcohol and a vinylidene chloride, methyl methacrylate, itaconic acid (88/10/2) terpolymer.

According to a fourteenth embodiment of a material having a conductive pattern, according to the present invention, the type A surface element has an outermost layer with respect to the support containing a proteinaceous binder e.g. gelatin, casein, collagen, albumin, keratin, gluten, zein and modified gelatin e.g. acetylated or phthaloyl gelatin.

According to a fifteenth embodiment of a material having a conductive pattern, according to the present invention, the type A surface element has an outermost layer with respect to the support containing gelatin.

According to a sixteenth embodiment of a material having a conductive pattern, according to the present invention, the type B surface element has an outermost layer with respect to the support which is exclusive of a proteinaceous binder and contains an optionally corona or glow discharge treated polymer containing a monomeric unit selected from the group consisting of acrylates e.g. ethyl acrylate, acrylic acid, ethylene, ethylene glycol, formaldehyde, itaconic acid, melamine, methacrylates e.g. methyl methacrylate, methacrylic acid, optionally substituted isophthalic acid e.g. 5-sulpho-isophthalic acid and isophthalic acid, optionally substituted terephthalic acid e.g. terephthalic acid and vinylidene chloride. Examples of suitable polymers for the outermost layer of type B surface element are:

PET=polyethylene terephthalate
LATEX01=vinylidene chloride, methyl methacrylate, itaconic acid (88/10/2) terpolymer, available as 30% aqueous dispersion
LATEX02=a copolyester of 26.5 mol % terephthalic acid, 20 mol % isophthalic acid, 3.5 mol % 5-sulphoisophthalic acid and 50 mol % ethylene glycol available as a 20% aqueous dispersion;
LATEX03=a copolymer of 80% ethyl acrylate and 20% methacrylic acid available as a 27% aqueous dispersion;
HORDAMER™ PE02=polyethylene from HOECHST, available as a 40% aqueous dispersion;
PAREZ RESIN™ 613=melamine-formaldehyde resin from AMERICAN CYANAMID available as 80% solids;

Suitable binders for use in the material for making a conductive pattern, according to the present invention, are described in EP-A 564 911 and include water-soluble polymers, such as poly(vinyl alcohol), water-soluble homo- and co-polymers of acrylic acid and homo- and co-polymers of methacrylic acid, and polymer latexes. Preferred binders include poly(vinyl alcohol) and homo- and co-polymers of hydroxyethyl methacrylate and copolymers of 2-propenoic acid 2-phosphonooxy)ethyl ester, copolymers of 2-methyl-2-propenoic acid 2-phosphonooxy)ethyl ester. Such binders may be treated with a hardening agent, e.g. an epoxysilane such as 3-glycidyloxypropyltrimethoxysilane as described in EP-A 564 911, which is especially suitable when coating on a glass substrate.

According to a fourteenth aspect of the material for making a conductive pattern, according to the present invention, the outermost layer with respect to the support of the type of surface element capable of being at least partially removed by a developer is corona or glow discharge treated polyethylene terephthalate.

According to a fifteenth aspect of the material for making a conductive pattern, according to the present invention, the outermost layer with respect to the support of the type of surface element capable of being at least partially removed by a developer contains polyethylene or a melamine-formaldehyde resin.

Examples of suitable polymers for use in the outermost layer with respect to the support of the type of surface element capable of being at least partially removed by a developer are: polyethylene terephthalate surface treated with a corona discharge or with a glow discharge, polyethylene, e.g. HORDAMER™ PE02, and melamine-formaldehyde resin, e.g. PAREZ RESINS 613.

According to a sixteenth aspect of the material for making a conductive pattern, according to the present invention, the outermost layer with respect to the support of the type of surface element not capable of being at least partially removed by a developer contains a polymer latex.

According to a seventeenth aspect of the material for making a conductive pattern, according to the present invention, the outermost layer with respect to the support of the type of surface element not capable of being at least partially removed by a developer contains a polymer containing a monomer unit selected from the group consisting of acrylates, acrylic acid, itaconic acid, methacrylates, methacrylic acid and vinylidene chloride.

According to an eighteenth aspect of the material for making a conductive pattern, according to the present invention, the outermost layer with respect to the support of the type of surface element not capable of being at least partially removed by a developer contains a polymer containing a monomer unit selected from the group consisting of ethylene glycol, optionally substituted isophthalic acid e.g. isophthalic acid and 5-sulpho-isophthalic acid, and optionally substituted terephthalic acid.

Examples of suitable polymers for use in the outermost layer with respect to the support of the type of surface element not capable of being at least partially removed by a developer are: LATEX01, LATEX02 and LATEX03.

Additional Ingredients

The conductive element, surface elements and any layers of the material, according to the present invention, may contain various additional ingredients, such as one or more binders, one or more surfactants, spacing particles, UV-acutance compounds and IR-absorbers.

According to a seventeenth embodiment of the material having a conductive pattern, according to the present invention, or a nineteenth embodiment of the material for making a conductive pattern, according to the present invention, the conductive element contains at least one anionic or non-ionic surfactant.

According to an eighteenth embodiment of the material having a conductive pattern, according to the present invention, or a twentieth embodiment of the material for making a conductive pattern, according to the present invention, the conductive element contains at least one non-ionic surfactant selected from the group of surfactants consisting of ethoxylated/fluroralkyl surfactants, polyethoxylated silicone surfactants, polysiloxane/polyether surfactants, ammonium salts of perfluro-alkylcarboxylic acids, polyethoxylated surfactants and fluorine-containing surfactants.

According to a nineteenth embodiment of the material having a conductive pattern, according to the present invention, or a twenty-first embodiment or the material for making a conductive pattern, according to the present invention, at least one type of the surface element contains at least one anionic or non-ionic surfactant.

Suitable non-ionic surfactants are:

Surfactant no. 01=ZONYL® FSN, a 40% by weight solution of $F(CF_2CF_2)_{1-9}CH_2CH_2O(CH_2CH_2O)_xH$ in a 50% by weight solution of isopropanol in water where x=0 to about 25, from DuPont;

Surfactant no. 02=ZONYL® FSN-100: $F(CF_2CF_2)_{1-9}CH_2CH_2O(CH_2CH_2O)_xH$ where x=0 to about 25, from DuPont;

Surfactant no. 03=ZONYL® FS300, a 40% by weight aqueous solution of a fluorinated surfactant, from DuPont;

Surfactant no. 04=ZONYL® FSO, a 50% by weight solution of a mixture of ethoxylated non-ionic fluoro-surfactant with the formula: $F(CF_2CF_2)_{1-7}CH_2CH_2O(CH_2CH_2O)_yH$ where y=0 to ca. 15 in a 50% by weight solution of ethylene glycol in water, from DuPont;

Surfactant no. 05=ZONYL® FSO-100, a mixture of ethoxylated non-ionic fluoro-surfactant from DuPont with the formula: $F(CF_2CF_2)_{1-7}CH_2CH_2O(CH_2CH_2O)_yH$ where y=0 to ca. 15 from DuPont;

Surfactant no. 06=Tegoglide® 410, a polysiloxane-polymer copolymer surfactant, from Goldschmidt;

Surfactant no. 07=Tegowet®, a polysiloxane-polyester copolymer surfactant, from Goldschmidt;

Surfactant no. 08=FLUORAD®FC431: $CF_3(CF_2)_7SO_2(C_2H_5)N$—$CH_2CO$—$(OCH_2CH_2)_nOH$ from 3M;

Surfactant no. 09=FLUORAD®FC126, a mixture of the ammonium salts of perfluorocarboxylic acids, from 3M;

Surfactant no. 10=polyoxyethylene-10-lauryl ether

Suitable Anionic Surfactants are:

Surfactant no. 11=ZONYL® 7950, a fluorinated surfactant, from DuPont;

Surfactant no. 12=ZONYL® FSA, 25% by weight solution of $F(CF_2CF_2)_{1-9}CH_2CH_2SCH_2CH_2COOLi$ in a 50% by weight solution of isopropanol in water, from DuPont;

Surfactant no. 13=ZONYL® FSE, a 14% by weight solution of $[F(CF_2CF_2)_{1-7}CH_2CH_2O]_xP(O)(ONH_4)_y$ where x=1 or 2; y=2 or 1; and x+y=3 in a 70% by weight solution of ethylene glycol in water, from DuPont;

Surfactant no. 14=ZONYL® FSJ, a 40% by weight solution of a blend of $[F(CF_2CF_2)_{1-7}CH_2CH_2O]_xP(O)(ONH_4)_y$ where x=1 or 2; y=2 or 1; and x+y=3 with a hydrocarbon surfactant in 25% by weight solution of isopropanol in water, from DuPont;

Surfactant no. 15=ZONYL® FSP, a 35% by weight solution of $[F(CF_2CF_2)_{1-7}CH_2CH_2O]_xP(O)(ONH_4)_y$ where x=1 or 2; y=2 or 1 and x+y=3 in 69.2% by weight solution of isopropanol in water, from DuPont;

Surfactant no. 16=ZONYL® UR: $[F(CF_2CF_2)_{1-7}CH_2CH_2O]_xP(O)(OH)_y$ where x=1 or 2; y=2 or 1 and x+y=3, from DuPont;

Surfactant no. 17=ZONYL® TBS: a 33% by weight solution of $F(CF_2CF_2)_{3-8}CH_2CH_2SO_3H$ in a 4.5% by weight solution of acetic acid in water, from DuPont;

Surfactant no. 18=Ammonium salt of perfluoro-octanoic acid;

Multidiazonium Salts

A multidiazonium salt is a salt with at least two groups with two nitrogen atoms bonded together with a double or triple bond, such groups including —N≡N⁺ and —N═N—R groups, e.g. —N═N—SO₃M groups e.g. bisdiazonium salts, trisdiazonium salts, tetrakisdiazonium salts, bis(aryldiazosulphonate) salts, tris(aryldiazosulphonate) salt and terakis(bis(aryldiazosulphonate) salts.

Upon exposure the adhesion of a conductive element containing a multidiazonium salt to the patterned surface is increased (due to the destruction of the diazonium groups) and additionally the photolysis products of the diazo may increase the level of crosslinking of the polymeric binder or resin comprising a multidiazonium salt if present. Combinations of multidiazonium salts can also be used.

Bisdiazonium salts for use in the material for making a conductive pattern, according to the present invention, include: benzidine tetrazoniumchloride, 3,3'-dimethylbenzidine tetrazoniumchloride, 3,3'-dimethoxybenzidine tetrazoniumchloride, 4,4'-diaminodiphenylamine tetrazoniumchloride, 3,3'-diethylbenzidine tetrazoniumsulphate, 4-aminodiphenylamine diazoniumsulphate, 4-aminodiphenylamine diazoniumchloride, 4-piperidino aniline diazoniumsulphate, 4-diethylamino aniline diazoniumsulphate and oligomeric condensation products of diazodiphenylamine and formaldehyde.

According to a twenty-second embodiment of a material for making a conductive pattern, according to the present invention, the conductive element further contains a multidiazonium salt, a resin comprising a diazonium salt or both a multidiazonium salt and a resin comprising a diazonium salt, which reduces the removability of those parts of the conductive element contiguous with the patterned surface not removed during the development step. Combinations of resins comprising a diazonium salt can also be used.

According to a twenty-third embodiment of the material for making a conductive pattern, according to the present invention, the conductive element contains a bis(aryldiazosulphonate) salt, a tris(aryldiazosulphonate) salt or a tetrakis(aryldiazosulphonate) salt.

According to a twenty-fourth embodiment of the material for making a conductive pattern, according to the present invention, the conductive element further contains a bis(aryldiazosulphonate) salt, which reduces the removability of exposed parts of the outermost layer, according to formula (II):

$$MO_3S—N═N—Ar—L—Ar—N═N—SO_3M \qquad (II)$$

where Ar is a substituted or unsubstituted aryl group, L is a divalent linking group, and M is a cation. L preferably represents a substituted or unsubstituted divalent aryl group or a substituted or unsubstituted saturated or unsaturated alkylene group, whose chain is optionally substituted with at least one of an oxygen atom, a sulphur atom or a nitrogen atom. Ar preferably represents an unsubstituted phenyl group or a phenyl group substituted with one or more alkyl groups, aryl groups, alkoxy groups, aryloxy groups or amino groups. M preferably represents a cation such as $NH_4^+$ or a metal ion such as a cation of Al, Cu, Zn, an alkaline earth metal or alkali metal.

Resins Comprising a Diazonium Salt

The term resin comprising a diazonium salt means a resin with groups with two nitrogen atoms bonded together with a double or triple bond, such groups including —N=—N+ and —N=N—R groups e.g. —N=N—SO₃M groups. Suitable resins comprising a diazonium salt, according to the present invention, include polymers or copolymers of an aryldiazosulphonate and condensation products of an aromatic diazonium salt. Such condensation products are described, for example, in DE-P-1 214 086.

Upon exposure the conductive element containing resins comprising a diazonium salt exhibits increased adhesion to the patterned surface and additionally the photolysis products of the diazo may increase the level of crosslinking of the polymeric binder or resin comprising a diazonium salt.

According to a twenty-fifth embodiment of the material for making a conductive pattern, according to the present invention, the conductive element further contains a polymer or copolymer of an aryldiazosulphonate.

According to a twenty-sixth embodiment of the material for making a conductive pattern, according to the present invention, the conductive element further contains a polymer or copolymer of an aryldiazosulphonate represented by formula (III):

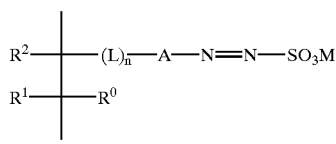

(III)

wherein $R^0$, $R^1$ and $R^2$ each independently represent hydrogen, an alkyl group, a nitrile or a halogen, e.g. Cl, L represents a divalent linking group, n represents 0 or 1, A represents an aryl group and M represents a cation. L preferably represents divalent linking group selected from the group consisting of: —(X)$_t$—CONR³—, —(X)$_t$—COO—, —X— and —(X)$_t$—CO—, wherein t represents 0 or 1; $R^3$ represents hydrogen, an alkyl group or an aryl group; X represents an alkylene group, an arylene group, an alkylenoxy group, an arylenoxy group, an alkylenethio group, an arylenethio group, an alkylenamino group, an arylenamino group, oxygen, sulphur or an aminogroup. A preferably represents an unsubstituted aryl group, e.g. an unsubstituted phenyl group or an aryl group, e.g. phenyl, substituted with one or more alkyl groups, aryl groups, alkoxy groups, aryloxy groups or amino groups. M preferably represents a cation such as $NH_4^+$ or a metal ion such as a cation of Al, Cu, Zn, an alkaline earth metal or alkali metal.

Polymers and copolymers of an aryldiazosulphonate can be prepared by homo- or copolymerization of aryldiazosulphonate monomers with other aryldiazosulphonate monomers and/or with vinyl monomers such as (meth)acrylic acid or esters thereof, (meth)acrylamide, acrylonitrile, vinylacetate, vinylchloride, vinylidene chloride, styrene, alpha-methyl styrene etc. A particularly preferred comonomer is hydroxyethylmethacrylate. Specific examples of suitable aryldiazosulphonate polymers are described in EP-A 771 645.

Combination of a Multidiazonium Salt and a Resin Comprising a Diazonium Salt

According to a twenty-seventh embodiment of the material for making a conductive pattern, according to the present invention, the conductive element further contains a combination of a resin comprising an aryldiazosulphonate and a bis(aryldiazosulphonate) salt.

According to a twenty-eighth embodiment of the material for making a conductive pattern, according to the present invention, the conductive element further contains a combination of a resin comprising an aryldiazosulphonate and a bis(aryldiazosulphonate) salt in the molar percentage ratio range of 60%/40% to 10%/90%.

According to a twenty-ninth embodiment of the material for making a conductive pattern, according to the present invention, the conductive element further contains a combination of a resin comprising an aryldiazosulphonate and a bis(aryldiazosulphonate) salt in the molar percentage ratio range of 50%/50% to 20%/80%.

According to a thirieth embodiment of the material for making a conductive pattern, according to the present invention, the conductive element further contains a combination of a copolymer of hydroxyethylmethacrylate and sodium-4-methacryloyl-aminophenyl-diazo-sulphonate and a bis(aryldiazosulphonate) salt.

Production Process for Materials of Present Invention

In the production of the materials of the present invention, the coating dispersions or solutions may be applied by any means known in the art: they can be spin-coated, sprayed or coated by any of the continuous coating techniques that are used to coat solutions on continuous webs, e.g. dip coating, rod coating, blade coating, air knife coating, gravure coating, reverse roll coating, extrusion coating, slide coating and curtain coating. An overview of these coating techniques can be found in the book "Modern Coating and Drying Technology", Edward Cohen and Edgar B. Gutoff Editors, VCH publishers, Inc, New York, N.Y., 1992. It is also possible to coat simultaneously multiple layers by coatings technique such as slide coating and curtain coating. It is also possible to apply the coating solutions and dispersions by printing techniques, e.g., ink-jet printing, gravure printing, flexo printing, or offset printing.

The coating solution or dispersion containing the intrinsically conductive polymer is preferably applied to the substrate in such an amount that the coated polymer layer contains between 10 and 5000 mg of intrinsically conductive polymer per m², more preferably between 100 and 500 mg of intrinsically conductive polymer per m².

The coating dispersion or solution of a polyanion and an intrinsically conductive polymer of the conductive element preferably also comprises an organic compound that is: a linear, branched or cyclic aliphatic $C_{2-20}$ hydrocarbon or an optionally substituted aromatic $C_{6-14}$ hydrocarbon or a pyran or a furan, the organic compound comprising at least two hydroxy groups or at least one —COX or —CONYZ group wherein X denotes —OH and Y and Z independently of one another represent H or alkyl; or a hetero-cyclic compound containing at least one lactam group. Examples of such organic compounds are e.g. N-methyl-2-pyrrolidinone, 2-pyrrolidinone, 1,3-dimethyl-2-imidazolidone, N,N,N',N'-tetramethyl-urea, formamide, dimethylformamide, and N,N-dimethylacetamide. Preferred examples are sugar or sugar derivatives such as arabinose, saccharose, glucose, fructose and lactose, or di- or polyalcohols such as sorbitol, xylitol, mannitol, mannose, galactose, sorbose, gluconic acid, ethylene glycol, di- or tri(ethylene glycol), 1,1,1-trimethylolpropane, 1,3-propanediol, 1,5-pentanediol, 1,2,3-propantriol, 1,2,4-butantriol, 1,2,6-hexantriol, or aromatic di- or polyalcohols such as resorcinol.

Exposure Process

Subsequent to processing the material of the present invention with a developer to remove at least partially those parts of the conductive element contiguous with one type of surface elements, the material of the present invention can be exposed to ultraviolet light optionally in combination with blue light in the wavelength range of 250 to 500 nm or infrared light. Useful exposure sources are high or medium pressure halogen mercury vapour lamps, e.g. of 1000 W or lasers having an emission wavelength in the range from about 700 to about 1500 nm, such as a semiconductor laser diode, a Nd:YAG laser or a Nd:YLF laser.

Development Process

The material of the present invention is developed in a developer which can be deionized water or is preferably water-based. During development those parts of the conductive element contiguous with one type of surface elements of the patterned surface are at least partially removed and a conductive pattern is thereby obtained. Suitable aqueous developers are deionized water, AZ303 (Clariant) or EN232 (AGFA-GEVAERT N.V.). When a subbing layer (also called substrate layer) is present on the support the material is preferably rubbed thoroughly with a tissue during development to avoid residual conductivity. The rubbing can be done in the processing fluid or in a separate water bath after the development stage. Similar results can be obtained by applying a high pressure water jet after the development stage, thereby avoiding contact with the conductive areas. Alternatively, if conductivity enhancement is necessary, the developer can contain the conductivity enhancement agent, thereby combining the steps of development and contact with the conductivity enhancement agent.

INDUSTRIAL APPLICATION

The conductive pattern obtained by the method of the present invention can be used as an electronic circuit for making an electric or semiconductor device such as a printed circuit board, an integrated circuit, a display, an electroluminescent device or a photovoltaic cell. The patterned electrode obtained by the method of the present invention can also be used for screening electromagnetic radiation or earthing electric charges, for making touch screens, radio frequency identification tags, electrochromic windows and in imaging systems, e.g. silver halide photography or electrophotography. Also a device such as the electronic book described in WO 97/04398 may particularly benefit from the flexible electrode of the present invention. Even more applications are described in WO 97/18944.

While the present invention will hereinafter be described in connection with preferred embodiments thereof, it will be understood that it is not intended to limit the invention to those embodiments. All percentages given in the EXAMPLES are percentages by weight unless otherwise stated.

EXAMPLES

Ingredients used in the conductive element which are not mentioned above are:

PEDOT=poly(3,4-ethylenedioxythiophene)
PSS=poly(styrenesulphonic acid)
NDP01=homopolymer of

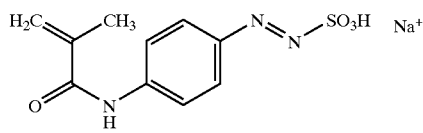

Ingredients used in the subbing layers not mentioned above:

KIESELSOL 100F=a colloid silica from BAYER, available as a 30% aqueous dispersion;

KIESELSOL 300F=a colloidal silica from BAYER, available as a 30% aqueous dispersion;
ARKOPON™T=a sodium salt of N-methyl-N-2-sulfoethyl-oleylamide by HOECHST a surfactant from HOECHST, supplied as a 40% concentrate;
MERSOLAT™H76=a sodium pentadecylsulfonate by BAYER, supplied as a 76% concentrate;
ULTRAVON™ W=a sodium arylsulfonate from CIBA-GEIGY, supplied as a 75–85% concentrate;
ARKOPAL™ N060=a nonylphenylpolyethylene-glycol from HOECHST;

The 100 μm polyethylene terephthalate (PET) film used in the EXAMPLES was treated as follows:

| Treatment nr. | Layer composition |
|---|---|
| 01 | 79.1% LATEX01; 18.6% KIESELSOL ™ 100F; 0.5% MERSOLAT ™ H; and 1.9% ULTRAVON ™ W |
| 02 | surface treated with a corona discharge |
| 03 | surface treated with an glow discharge |
| 04 | layer combination consisting of a 1st layer of 79.1% LATEX01; 18.6% KIESELSOL ™ 100F; 0.5% MERSOLAT ™ H; and 1.9% ULTRAVON ™ W; and a 2nd layer consisting of 49% gelatin, 44% KIESELSOL ™ 300F, 1.72% ULTRAVON ™W, 0.86% ARKOPAL ™ N060, 2.86% hexylene glycol, 1.43% trimethylol propane and 0.13% of 3 μm polymethyl methacylate particles |
| 05 | 77.2% of LATEX02; 5.8% of LATEX03; 1.3% HORDAMER ™ PE02 and 14.6% PAREZ RESIN ™ 613. |
| 06 | layer combination consisting of a first layer of 85.6% of LATEX01, 9.5% of KIESELSOL ™ 100F, 2.5% of PEDOT/PSS, 0.5% of MERSOLAT ™ 76H and 1.9% ULTRAVON ™ W; and a second layer consisting of 49% gelatin, 44% KIESELSOL ™ 300F, 1.72% ULTRAVON ™ W, 0.86% ARKOPAL ™ N060, 2.86% 2-methyl-2,4- pentanediol, 1.43% trimethylol propane and 0.13% of 3 μm polymethyl methacylate particles |
| 07 | 79.8% LATEX02; 19.9% KIESELSOL ™ 100F; and 0.3% ARKOPON ™ T |
| 08 | 75.0% LATEX01, 9.0% LATEX03 and 16.0% KIESELSOL ™ 100F |

For the corona discharge treatment of PET film in air, an AHLBRANDT™ corona treater type 53-02 was used consisting of 2 quartz electrodes, a grounded treater roll and a 15 kHz generator. The air gap between the electrode and film was 1.2 mm and the film was endowed with optimal adhesion properties by transporting it at a speed of 10 m/min under the corona treater at a watt density of 400 Wmin/m$^2$.

The glow discharge treatment of PET film was carried out in a vacuum system consisting of a reactor vessel, vacuum pumps, a gas inlet, a DC power source and a titanium glow cathode. The operating conditions used were a transport speed of 40 m/min, an air pressure of 10$^{-2}$ mbar and a power density of 40 Wmin/m and a distance between the cathode and film of 100 mm.

PEDOT/PSS Dispersion

The aqueous dispersions of PEDOT/PSS in a weight ratio of 1:2.4 used in the EXAMPLES were prepared according to the method described in EP-A 1 079 397. The particle size of the PEDOT/PSS latex was determined by CPS disc centrifuge measurements to be narrow with a maximum at 25 nm and an average particle size of 30–50 nm.

Example 1

In EXAMPLE 1, the conductive element consisted of PEDOT/PSS and ZONYL™ FSO 100 and was coated from a dispersion containing N-methyl pyrrolidinone and diethylene glycol for Samples I and II respectively. Samples I and II were produced by coating 40 mL/m² of the dispersion given in Table 1 on a PET support partially with treatment nr. 03 (IA and IIA) and partially with treatment nr. 04 (IB and IIB) to a wet thickness of 50 μm. After drying Samples I and II for 10 minutes at 50° C. and 20 minutes at 110° C. respectively they had the compositions given in Table 1.

TABLE 1 composition of the coating dispersions

| | SAMPLE | | SAMPLE | |
|---|---|---|---|---|
| | IA | IB | IIA | IIB |
| | | Treatment nrs. | | |
| INGREDIENT [mL] | 03 | 04 | 03 | 04 |
| 1.2% aqueous dispersion of PEDOT/PSS | 16.7 | 16.7 | 12.5 | 12.5 |
| 2% aqueous solution of ZONYL ™ FSO 100 | 0.50 | 0.50 | 0.50 | 0.50 |
| N-methyl-pyrrolidinone | 2.50 | 2.50 | — | — |
| diethylene glycol | — | — | 2.75 | 2.75 |
| deionized water | 30.30 | 30.30 | 34.25 | 34.25 |
| COVERAGE [mg/m²] | | | | |
| PEDOT/PSS | 200 | 200 | 150 | 150 |
| ZONYL FSO 100 | 10 | 10 | 10 | 10 |

The surface resistances of the parts of the PEDOT/PSS-containing conductive element contiguous with treatment nr. 03 and those contiguous with treatment nr. 04 were determined as described above and the results are given in Table 2.

TABLE 2

| | SAMPLES | |
|---|---|---|
| PROPERTY | I | II |
| $R_s$ (Ω/square) of conductive element contiguous with treatment nr. 04 | $3.4 \times 10^4$ | $3.55 \times 10^3$ |
| $R_s$ (Ω/square) of conductive element contiguous with treatment nr. 03 | $1.0 \times 10^3$ | $1.4 \times 10^3$ |
| $R_s$ ratio of parts of conductive element contiguous with treatment nr. 04/parts of conductive element contiguous with treatment nr. 03 | 34 | 2.5 |

A $R_s$ ratio of parts of conductive element contiguous with treatment nr. 04/parts of conductive element contiguous with treatment nr. 03 was 34 with sample I and 2.5 with samples II, showing the strong influence of choice of conductivity-enhancing agent on the $R_s$-ratio observed. In both cases a conductive pattern was realized.

Example 2

In EXAMPLE 2, the conductive element consisted of PEDOT/PSS, NDP01 and ZONYL™ FSO 100 and was coated from a dispersion containing N-methyl pyrrolidinone. Sample III was produced by coating 40 mL/m² of the dispersion given in Table 3 on a PET support partially with treatment nr. 01 (IIIA) and partially with treatment nr. 04 (IIIB) to a wet thickness of 40 μm. After drying the conductive elements of Sample III had the compositions given in Table 3.

TABLE 3 composition of the coating dispersions

| | SAMPLE | |
|---|---|---|
| | IIIA | IIIB |
| | Treatment nrs. | |
| INGREDIENT [mL] | 01 | 04 |
| 1.2% aqueous dispersion of PEDOT/PSS | 1668 | 1668 |
| 17.8% by weight aqueous solution of NDP01 | 56 | 56 |
| 2% aqueous solution of ZONYL ™ FSO 100 | 40 | 40 |
| N-methyl-pyrrolidinone | 200 | 200 |
| deionized water | 2036 | 2036 |
| COVERAGE [mg/m²] | | |
| PEDOT/PSS | 200 | 200 |
| NDP02 | 100 | 100 |
| ZONYL ™ FSO 100 | 8 | 8 |

The surface resistances of the parts of the PEDOT/PSS-containing conductive element contiguous with treatment nr. 01 and those contiguous with treatment nr. 04 were determined as described above and the results are given in Table 4.

TABLE 4

| PROPERTY | |
|---|---|
| $R_s$ (Ω/square) of conductive element contiguous with treatment nr. 04 (SAMPLE IIIB) | $1.8 \times 10^5$ |
| $R_s$ (Ω/square) of conductive element contiguous with treatment nr. 01 (SAMPLE IIIA) | $5.2 \times 10^3$ |
| $R_s$ ratio of parts of conductive element contiguous with treatment nr. 04/parts of conductive element contiguous with treatment nr. 01 | 34.6 |

A $R_s$ ratio of parts of conductive element contiguous with treatment nr. 04/parts of conductive element contiguous with treatment nr. 01 of 34.6 showed that a conductive pattern had been realized. The presence of the diazosulphonate copolymer NDP01 slightly increased the surface resistance values.

Example 3

In EXAMPLE 3, the conductive element consisted of PEDOT/PSS and ZONYL™ FSO 100 and was coated from dispersions containing N-methyl pyrrolidinone. Samples IV to VII were produced by coating to the wet thicknesses given in Table 5 on PET supports with treatment nrs. 3 and 4. After drying the Samples IV to VII had the compositions also given in Table 5.

TABLE 5 composition of the coating dispersions

| | SAMPLE | | | |
|---|---|---|---|---|
| | IV | V | VI | VII |
| | | Treatment nr. | | |
| INGREDIENT [mL] | 3/4 | 3/4 | 3/4 | 3/4 |
| 1.2% aqueous dispersion of PEDOT/PSS | 16.70 | 20.83 | 41.66 | 41.66 |
| 2% aqu. solution of ZONYL ™ FSO 100 | 0.50 | 0.50 | 0.50 | 0.50 |
| N-methyl-pyrrolidinone | 2.50 | 3.12 | 6.24 | 6.24 |
| deionized water | 30.3 | 30.3 | 30.3 | 30.3 |
| WET COVERAGE [μm] | 50 | 100 | 100 | 200 |
| DRY COVERAGE | | | | |

TABLE 5-continued composition of the coating dispersions

|  | SAMPLE | | | |
|---|---|---|---|---|
|  | IV | V | VI | VII |
|  | Treatment nr. | | | |
| INGREDIENT [mL] | 3/4 | 3/4 | 3/4 | 3/4 |
| [mg/m$^2$] | | | | |
| PEDOT/PSS | 200 | 500 | 1000 | 2000 |
| ZONYL ™ FSO 100 | 10 | 20 | 20 | 40 |

The surface resistances of SAMPLES IV to VII were determined as described above and the results are given in Table 6.

TABLE 6

|  | SAMPLE | | | |
|---|---|---|---|---|
| PROPERTY | IV | V | VI | VII |
| Thickness of electroconductive layer [nm] | 200 | 500 | 1000 | 2000 |
| $R_s$ (Ω/square) of conductive element contiguous with treatment nr. 04 | $3.4 \times 10^4$ | 675 | 200 | 95 |
| $R_s$ (Ω/square) of conductive element contiguous with treatment nr. 03 | $1.0 \times 10^3$ | 440 | 185 | 83 |
| $R_s$ ratio of parts of conductive element contiguous with treatment nr. 04/parts of conductive element contiguous with treatment nr. 03 | 34 | 1.5 | 1.1 | 1.1 |

From Table 6 it can be seen that the influence of the support on the surface resistance decreased considerably with increasing layer thickness, no significant effect being observed at layer thicknesses greater than 500 nm.

Example 4

In EXAMPLE 4, the conductive element consisted of PEDOT/PSS, NDP01 and ZONYL™ FSO 100 and was coated from a dispersion containing N-methyl pyrrolidinone. Samples VIII to XV were produced by coating 40 mL/m$^2$ of the dispersions given in Table 7 on Support nr. 1 to 8 to a wet thickness of 40 μm. After drying the Samples VIII to XV had the compositions also given in Table 7.

TABLE 7 composition of the coating dispersions

|  | SAMPLE | | | | | | | |
|---|---|---|---|---|---|---|---|---|
|  | VIII | IX | X | XI | XII | XIII | XIV | XV |
| INGREDIENT | Treatment nr. | | | | | | | |
| [mL] | 1 | 2 | 3 | 4 | 5 | 6 | 7 | 8 |
| 1.2% aqueous dispersion of PEDOT/PSS | 1668 | 1668 | 1668 | 1668 | 1668 | 1668 | 1668 | 1668 |
| 17.8% aq. sol. of NDP01 | 56 | 56 | 56 | 56 | 56 | 56 | 56 | 56 |
| 2% aqueous solution of ZONYL ™ FSO 100 | 40 | 40 | 40 | 40 | 40 | 40 | 40 | 40 |
| N-methyl-pyrrolidinone | 200 | 200 | 200 | 200 | 200 | 200 | 200 | 200 |

TABLE 7-continued composition of the coating dispersions

|  | SAMPLE | | | | | | | |
|---|---|---|---|---|---|---|---|---|
|  | VIII | IX | X | XI | XII | XIII | XIV | XV |
| INGREDIENT | Treatment nr. | | | | | | | |
| [mL] | 1 | 2 | 3 | 4 | 5 | 6 | 7 | 8 |
| deionized water | 2036 | 2036 | 2036 | 2036 | 2036 | 2036 | 2036 | 2036 |
| COVERAGE [mg/m$^2$] | | | | | | | | |
| PEDOT/PSS | 200 | 200 | 200 | 200 | 200 | 200 | 200 | 200 |
| NDP02 | 100 | 100 | 100 | 100 | 100 | 100 | 100 | 100 |
| ZONYL ™ FSO 100 | 8 | 8 | 8 | 8 | 8 | 8 | 8 | 8 |

The surface resistances of SAMPLES VIII to XV were determined as described above and the results are given in Table 8. The Samples were then processed in water (softly rubbing with a tissue under water) and dried and the surface resistances determined. The results after processing in water are also given in Table 8.

From Table 8 it can be seen that the PEDOT/PSS-containing conductive element contiguous with surface elements containing gelatin (treatment nrs. 4 and 6) exhibited considerably higher surface resistances than the PEDOT/PSS-containing conductive element contiguous with surface elements not containing gelatin.

TABLE 8

|  | SAMPLE | | | | | | | |
|---|---|---|---|---|---|---|---|---|
|  | VIII | IX | X | XI | XII | XIII | XIV | XV |
|  | Treatment nr | | | | | | | |
| PROPERTY | 1 | 2 | 3 | 4 | 5 | 6 | 7 | 8 |
| $R_s$ (Ω/square) of coated layer before processing | $5.2 \times 10^3$ | $3.8 \times 10^3$ | $3.8 \times 10^3$ | $1.8 \times 10^5$ | $4.1 \times 10^3$ | $2.5 \times 10^5$ | $4.0 \times 10^3$ | $9.7 \times 10^3$ |
| $R_s$ (Ω/square) of coated layer after processing | $4.2 \times 10^5$ | $6.5 \times 10^{12}$ | $6.2 \times 10^{12}$ | $9.9 \times 10^8$ | $3.8 \times 10^{12}$ | $9.0 \times 10^6$ | $9.6 \times 10^5$ | $1.1 \times 10^5$ |

The results given in Table 8 also indicate that the particular support used had a crucial effect on the surface resistance of the layer after processing with water. In the cases of treatment nrs 1, 7 and 8 only a marginal increase in surface resistance was observed, indicating that the layer was incompletely removed although under a microscope the layer appeared to have been removed, whereas in the cases of treatment nrs 2, 3 and 5 (Samples IX, X and XII) surface resistances of ca. $5 \times 10^{12}$ Ω/square were observed, indicating a more complete removal of the layer. Therefore, a potential $R_s$ ratio after processing of $10^7$ is achievable using two types of surface element.

In the cases of samples VIII, XIII, XIV and XV coated on treatment nrs 1, 6, 7 and 8 surface resistances $>10^7$ Ω/square could be obtained by rubbing thoroughly with a tissue during processing (results not shown in Table 8). However, subsequent exposure on a PRINTON™ CDL 1502i UV contact exposure unit (from AGFA-GEVAERT N.V.) for 200s at 2 mW/cm$^2$ (=exposure of 0.4 J/cm$^2$) resulted in strongly increased adhesion without significant increase in surface resistance.

The present invention may include any feature or combination of features disclosed herein either implicitly or explicitly or any generalisation thereof irrespective of whether it relates to the presently claimed invention. In view of the foregoing description it will be evident to a person skilled in the art that various modifications may be made within the scope of the invention.

We claim:

1. A material for making a conductive pattern, said material comprising a support, a patterned surface, and a conductive element, said conductive element containing a polyanion and an intrinsically conductive polymer, wherein said patterned surface is provided with the conductive element and one surface of said conductive element is an outermost surface of said material, the other surface of said conductive element being contiguous with said patterned surface, said patterned surface consisting of surface elements, said surface elements being of at least two types, and the parts of said conductive element contiguous with one type of said at least two types of said surface elements being capable of being at least partially removed by a developer.

2. Material according to claim 1, wherein said conductive pattern is an electroconductive pattern.

3. Material according to claim 1, wherein said patterned surface is planar.

4. Material according to claim 3, wherein said planar patterned surface is the surface of said support or a patternwise treated continuous layer.

5. Material according to claim 4, wherein said patternwise treatment is carried out with a corona discharge or a glow discharge.

6. Material according to claim 1, wherein said intrinsically conductive polymer is a polymer or copolymer of a substituted or unsubstituted thiophene.

7. Material according to claim 6, wherein said polymer of a substituted or unsubstituted thiophene is represented by formula (I):

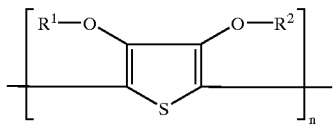

in which n is larger than 1 and each of $R^1$ and $R^2$ independently represent hydrogen or an optionally substituted $C_{1-4}$ alkyl group or together represent an optionally substituted $C_{1-4}$ alkylene group or an optionally substituted cycloalkylene group, preferably an ethylene group, an optionally alkyl-substituted methylene group, an optionally $C_{1-12}$ alkyl- or phenyl-substituted ethylene group, a 1,3-propylene group or a 1,2-cyclohexylene group.

8. Material according to claim 1, wherein said polyanion is poly(styrenesulphonate).

9. Material according to claim 1, wherein said patterned surface is non-planar.

10. Material according to claim 9, wherein said non-planar patterned surface consists of a non-continuous layer provided on a continuous layer or on said support.

11. A material for making a conductive pattern, said material comprising a support and a conductive element, said conductive element containing a polyanion and an intrinsically conductive polymer, wherein one surface of said conductive element is an outermost surface of said material, the other surface of said conductive element is contiguous with a patterned surface, said patterned surface consisting of surface elements, said surface elements being of at least two types, and the parts of said conductive element contiguous with one type of said at least two types of said surface elements are capable of being at least partially removed by a developer, wherein said conductive element further contains a multidiazonium salt, a resin comprising a diazonium salt or both a multidiazonium salt and a resin comprising a diazonium salt.

12. Material according to claim 11, wherein said patterned surface is planar.

13. Material according to claim 11, wherein said patterned surface is non-planar.

14. Material according to claim 13, wherein said non-planar patterned surface consists of a non-continuous layer provided on a continuous layer or on said support.

15. Material according to claim 11, wherein said conductive pattern is an electroconductive pattern.

16. Material according to claim 11, wherein said planar patterned surface is the surface of said support or a patternwise treated continuous layer.

17. Material according to claim 11, wherein said patternwise treatment is carried out with a corona discharge or a glow discharge.

18. Material according to claim 11, wherein said intrinsically conductive polymer is a polymer or copolymer of a substituted or unsubstituted thiophene.

19. Material according to claim 18, wherein said polymer of a substituted or unsubstituted thiophene is represented by formula (1):

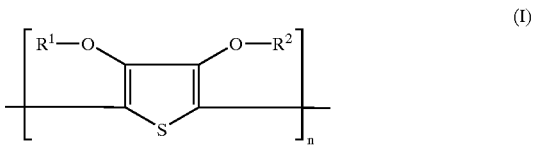

in which n is larger than 1 and each of $R^1$ and $R^2$ independently represent hydrogen or an optionally substituted $C_{1-4}$ alkyl group or together represent an optionally substituted $C_{1-4}$ alkylene group or an optionally substituted cycloalkylene group, preferably an ethylene group, an optionally alkyl-substituted methylene group, an optionally $C_{1-12}$ alkyl- or phenyl-substituted ethylene group, a 1,3-propylene group or a 1,2-cyclohexylene group.

20. Material according to claim 11, wherein said polyanion is poly(styrenesulphonate).

21. A material for making a conductive pattern, said material comprising a support and a conductive element, said conductive element containing a polyanion and an intrinsically conductive polymer, wherein one surface of said conductive element is an outermost surface of said material, the other surface of said conductive element is contiguous with a patterned surface, said patterned surface consisting of surface elements, said surface elements being of at least two types, and the parts of said conductive element contiguous with one type of said at least two types of said surface elements are capable of being at least partially removed by a developer, wherein said conductive element further contains a bis(aryldiazosulphonate) salt, which is capable of reducing the removability of the outermost layer if said outermost layer is exposed, according to formula (II):

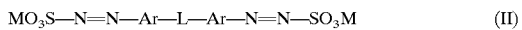

MO$_3$S—N=N—Ar—L—Ar—N=N—SO$_3$M       (II)

where Ar is a substituted or unsubstituted aryl group, L is a divalent linking group, and M is a cation.

22. Material according to claim 21, wherein said patterned surface is planar.

23. Material according to claim 21, wherein said patterned surface is non-planar.

24. Material according to claim 23, wherein said non-planar patterned surface consists of a non-continuous layer provided on a continuous layer or on said support.

25. Material according to claim 21, wherein said conductive pattern is an electroconductive pattern.

26. Material according to claim 21, wherein said planar patterned surface is the surface of said support or a patternwise treated continuous layer.

27. Material according to claim 21, wherein said patternwise treatment is carried out with a corona discharge or a glow discharge.

28. Material according to claim 21, wherein said intrinsically conductive polymer is a polymer or copolymer of a substituted or unsubstituted thiophene.

29. Material according to claim 28, wherein said polymer of a substituted or unsubstituted thiophene is represented by formula (I):

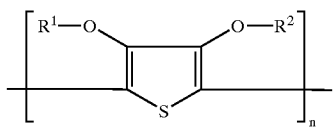

in which n is larger than 1 and each of $R^1$ and $R^2$ independently represent hydrogen or an optionally substituted $C_{1-4}$ alkyl group or together represent an optionally substituted $C_{1-4}$ alkylene group or an optionally substituted cycloalkylene group, preferably an ethylene group, an optionally alkyl-substituted methylene group, an optionally $C_{1-12}$ alkyl- or phenyl-substituted ethylene group, a 1,3-propylene group or a 1,2-cyclohexylene group.

30. Material according to claim 21, wherein said polyanion is poly(styrenesulphonate).

31. A material for making a conductive pattern, said material comprising a support and a conductive element, said conductive element containing a polyanion and an intrinsically conductive polymer, wherein one surface of said conductive element is an outermost surface of said material, the other surface of said conductive element is contiguous with a patterned surface, said patterned surface consisting of surface elements, said surface elements being of at least two types, and the parts of said conductive element contiguous with one type of said at least two types of said surface elements are capable of being at least partially removed by a developer, wherein said conductive element further contains a polymer or copolymer of an aryldiazosulphonate represented by formula (III):

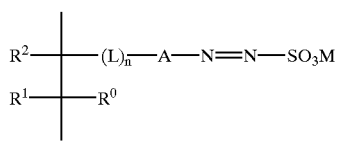

wherein $R^0$, $R^1$ and $R^2$ each independently represent hydrogen, an alkyl group, a nitrile or a halogen, L represents a divalent linking group, n represents 0 or 1, A represents an aryl group and M represents a cation.

32. Material according to claim 31, wherein said patterned surface is planar.

33. Material according to claim 31, wherein said patterned surface is non-planar.

34. Material according to claim 33, wherein said non-planar patterned surface consists of a non-continuous layer provided on a continuous layer or on said support.

35. Material according to claim 31, wherein said conductive pattern is an electroconductive pattern.

36. Material according to claim 31, wherein said planar patterned surface is the surface of said support or a patternwise treated continuous layer.

37. Material according to claim 31, wherein said patternwise treatment is carried out with a corona discharge or a glow discharge.

38. Material according to claim 31, wherein said intrinsically conductive polymer is a polymer or copolymer of a substituted or unsubstituted thiophene.

39. Material according to claim 38, wherein said polymer of a substituted or unsubstituted thiophene is represented by formula (I):

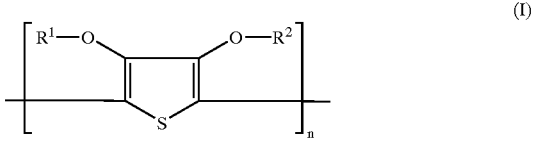

in which n is larger than 1 and each of $R^1$ and $R^2$ independently represent hydrogen or an optionally substituted $C_{1-4}$ alkyl group or together represent an optionally substituted $C_{1-4}$ alkylene group or an optionally substituted cycloalkylene group, preferably an ethylene group, an optionally alkyl-substituted methylene group, an optionally $C_{1-12}$ alkyl- or phenyl-substituted ethylene group, a 1,3-propylene group or a 1,2-cyclohexylene group.

40. Material according to claim 31, wherein said polyanion is poly(styrenesulphonate).

41. A material for making a conductive pattern, said material comprising a support and a conductive element, said conductive element containing a polyanion and a water-insoluble intrinsically conductive polymer, wherein one surface of said conductive element is an outermost surface of said material, the other surface of said conductive element is contiguous with a patterned surface, said patterned surface consisting of surface elements, said surface elements being of at least two types, and the parts of said conductive element contiguous with one type of said at least two types of said surface elements are capable of being at least partially removed by a developer.

42. Material according to claim 41, wherein said patterned surface is planar.

43. Material according to claim 41, wherein said patterned surface is non-planar.

44. Material according to claim 43, wherein said non-planar patterned surface consists of a non-continuous layer provided on a continuous layer or on said support.

45. Material according to claim 41, wherein said conductive pattern is an electroconductive pattern.

46. Material according to claim 41, wherein said planar patterned surface is the surface of said support or a patternwise treated continuous layer.

47. Material according to claim 41, wherein said patternwise treatment is carried out with a corona discharge or a glow discharge.

48. Material according to claim 41, wherein said intrinsically conductive polymer is a polymer or copolymer of a substituted or unsubstituted thiophene.

49. Material according to claim 48, wherein said polymer of a substituted or unsubstituted thiophene is represented by formula (I):

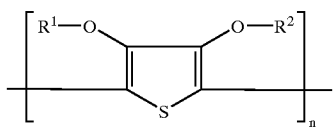 (I)

in which n is larger than 1 and each of $R^1$ and $R^2$ independently represent hydrogen or an optionally substituted $C_{1-4}$ alkyl group or together represent an optionally substituted $C_{1-4}$ alkylene group or an optionally substituted cycloalkylene group, preferably an ethylene group, an optionally alkyl-substituted methylene group, an optionally $C_{1-12}$ alkyl- or phenyl-substituted ethylene group, a 1,3-propylene group or a 1,2-cyclohexylene group.

50. Material according to claim 41, wherein said polyanion is poly(styrenesulphonate).

* * * * *